US009837517B2

(12) United States Patent
Xiao et al.

(10) Patent No.: US 9,837,517 B2
(45) Date of Patent: *Dec. 5, 2017

(54) METHOD FOR MAKING III-V NANOWIRE QUANTUM WELL TRANSISTOR

(71) Applicant: ZING SEMICONDUCTOR CORPORATION, Shanghai (CN)

(72) Inventors: Deyuan Xiao, Shanghai (CN); Richard R. Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,764

(22) Filed: Mar. 8, 2017

(65) Prior Publication Data

US 2017/0179269 A1 Jun. 22, 2017

Related U.S. Application Data

(62) Division of application No. 15/161,504, filed on May 23, 2016, now Pat. No. 9,640,615.

(30) Foreign Application Priority Data

Oct. 15, 2015 (CN) .......................... 2015 1 0667042

(51) Int. Cl.
*H01L 27/118* (2006.01)
*H01L 29/775* (2006.01)
(Continued)

(52) U.S. Cl.
CPC ........ *H01L 29/775* (2013.01); *H01L 29/0669* (2013.01); *H01L 29/42392* (2013.01);
(Continued)

(58) Field of Classification Search
CPC ......... H01L 21/02532; H01L 21/02603; H01L 21/02654; H01L 29/16; H01L 29/454; H01L 29/4966
(Continued)

(56) References Cited

U.S. PATENT DOCUMENTS

2014/0151639 A1 6/2014 Chang et al.
2014/0197377 A1 7/2014 Kim et al.
2017/0110373 A1* 4/2017 Xiao ............... H01L 21/823807

FOREIGN PATENT DOCUMENTS

TW 201528511 A 7/2015

* cited by examiner

*Primary Examiner* — Tan N Tran
(74) *Attorney, Agent, or Firm* — Huffman Law Group, PC (57) ABSTRACT

The present invention provides a field effect transistor and the method for preparing such a filed effect transistor. The filed effect transistor comprises a semiconductor, germanium nanowires, a first III-V compound layer surrounding the germanium nanowires, a semiconductor barrier layer, a gate dielectric layer and a gate electrode sequentially formed surrounding the first III-V compound layer, and source/drain electrodes are respectively located at each side of the gate electrode and on the first III-V compound layer. According to the present invention, the band width of the barrier layer is greater than that of the first III-V compound layer, and the band curvatures of the barrier layer and the first III-V compound layer are different, therefore, a two-dimensional electron gas (2DEG) is formed in the first III-V compound layer near the barrier layer boundary. Since the 2DEG has higher mobility, the performance of the filed effect transistor improved. Besides, the performance of the filed effect transistor also improved due to the structure is a gate-all-around structure.

8 Claims, 8 Drawing Sheets (51) Int. Cl.
*H01L 29/06* (2006.01)
*H01L 29/786* (2006.01)
*H01L 29/423* (2006.01)
*H01L 29/51* (2006.01)
*H01L 29/49* (2006.01)
*H01L 29/66* (2006.01)

(52) U.S. Cl.
CPC ........ *H01L 29/4908* (2013.01); *H01L 29/517* (2013.01); *H01L 29/66439* (2013.01); *H01L 29/78681* (2013.01); *H01L 29/78684* (2013.01); *H01L 29/78696* (2013.01); *H01L 2029/42388* (2013.01)

(58) Field of Classification Search
USPC .......................................... 257/210, E51.04
See application file for complete search history.

FIG. 1

| Providing a substrate, wherein the semiconductor substrate has trenches, and germanium nanowires floated above the trenches | ~S1 |
| Sequentially forming first and second iii-v compound layers surrounding around the germanium nanowires | ~S2 |
| Forming an opening in the second iii-v compound layer to expose the first iii-v compound layer | ~S3 |
| Sequentially forming a barrier layer, a gate dielectric layer, and a gate electrode in the opening | ~S4 |
| Forming side walls at two sides of said gate electrode | ~S5 |
| Forming a source region and a drain region by doping n type impurities into said second iii-v compound layer | ~S6 |

METHOD FOR MAKING III-V NANOWIRE QUANTUM WELL TRANSISTOR

CROSS REFERENCE TO RELATED APPLICATION(S)

This application is a divisional of U.S. application Ser. No. 15/161,504 filed on May 23, 2016 which claims priority from P.R.C. Patent No. 201510667042.5 filed on Oct. 21, 2015, the contents of both of which are hereby incorporated by reference in their entirety for all purposes.

TECHNICAL FIELD

The present invention relates to a method for manufacturing a semiconductor device, and particularly relates to a field-effect transistor and method of making it.

BACKGROUND

A high-electron-mobility transistor (HEMT) includes a modulation doped heterojunction structure. Because band gaps of two materials composing the heterojunction structure are different, potential wells and potential barriers are formed at the interface of the heterojunction structure after the gate of the heterojunction structure is biased. Because a polarization effect or free electrons are accumulated at the potential wells near the interface of the heterojunction structure, two-dimensional electron gases (2-DEG) are formed at the potential wells. Because the two-dimensional electron gas is not affected by scattered impurity ions, the electron mobility of the two dimensional electron gas is very high. Moreover, an impurity center is not frozen at a very low temperature because electrons are spaced apart the impurity center, so that HEMT has a very perfect performance at a very low temperature and can be used for a research work (such as fractional quantum Hall effect) at a very low temperature. HEMT is a voltage controlling device, and the depths of the potential wells can be regulated by the gate voltage (Vg) to control the surface density of 2-DEG in the potential wells to control HEMT's operating current. A middle region of an ingot with the same diameter only can be used for cutting a wafer, and head and tail regions of the ingot need to be removed. Because the weights of the head and tail regions gradually increase with the diameter of the ingot, it needs to recycle the ingot for reducing the cost and enhancing the performance.

SUMMARY

An object of the present invention application is to provide a field-effect transistor and method thereof, wherein the field-effect transistor is a high electron mobility transistor and has better performance.

In order to solve the above problems, the present invention provides a field-effect transistor. The field-effect transistor comprises of a semiconductor substrate, a germanium nanowire on the substrate, a first III-V compound layer surrounding around the germanium nanowire, a barrier layer, a gate dielectric layer, and a gate electrode sequentially on the first III-V compound layer, and a source region and a drain region on the first III-V compound layer and at one side of the gate electrode respectively.

In one embodiment, the germanium nanowires are doped with P type impurities, the germanium nanowires are circular shapes, and the thickness of the germanium nanowires are 10 nm~100 nm.

In one embodiment, the first III-V compound layer is N type InGaAs, and the thickness of the first III-V compound layer is 10 nm~100 nm.

In one embodiment, the barrier layer is silicon doped InP, and the InP doping concentration is $1.0 \times 10^{17}$ cm$^{-3}$~$1.5 \times 10^{18}$ cm$^{-3}$, the thickness of the barrier layer is 50 nm~100 nm.

In one embodiment, the gate dielectric layer is high dielectric constant materials, the gate dielectric layer is $Al_2O_3$, or $TiSiO_x$, and the thickness of the gate dielectric layers is 1 nm~5 nm.

In one embodiment, the gate electrode is a material of TiN, NiAu or CrAu.

In one embodiment, the source region and the drain region are $In_{0.25}Ga_{0.75}As$ doped with N-type impurities.

In one embodiment, the field effect transistor further comprises sidewalls at two sides of the gate electrode, a source electrode on the source region, and a drain electrode on the drain region.

The present invention application also provides a method for manufacturing a field-effect transistor, and the method comprising the steps of:

providing a semiconductor substrate, wherein the semiconductor substrate has trenches, and germanium nanowires floated above the trenches;

sequentially forming first and second III-V compound layers surrounding around the germanium nanowires;

forming an opening in the second III-V compound layer to expose the first III-V compound layer;

sequentially forming a barrier layer, a gate dielectric layer, and a gate electrode in the opening;

forming sidewalls at two sides of the gate electrode;

forming a source region and a drain region by doping N type impurities into the second III-V compound layer.

In one embodiment, the germanium nanowires are formed by the steps comprising:

forming a silicon germanium alloy layer, and silicon germanium alloy layer covering the semiconductor substrate;

forming a plurality of shallow trench isolations, and the shallow trench isolations segmenting the silicon germanium alloy layer;

removing a part of shallow trench isolations, and exposing one side of the silicon germanium alloy layer;

transferring the silicon germanium alloy layer to a polygon shaped silicon germanium alloy layer by a selective epitaxial growth;

transferring the polygon shaped silicon germanium alloy layer to a silicon oxide layer, the germanium nanowires by a thermal oxidation, the silicon oxide layer surrounding around the germanium nanowires;

removing the silicon oxide layer to form trenches, and germanium nanowires floated above the trenches;

annealing the germanium nanowires at a hydrogen atmosphere; and forming a silicon oxide layer in the trench.

In one embodiment, the germanium nanowires are doped with P type impurities, the germanium nanowires are circular shapes, and the thickness of the germanium nanowires are 10 nm~100 nm.

In one embodiment, the first III-V compound layer is formed by atomic layer deposition (ALD), molecular beam epitaxy (MBE), or metal organic chemical vapor deposition (MOCVD), the first III-V compound layers is N type InGaAs, and the thickness of the first III-V compound layer is 10 nm~100 nm.

In one embodiment, the second III-V compound layer is formed by atomic layer deposition, molecular beam epitaxy, or metal organic chemical vapor deposition, the materials of the second III-V compound layer is $In_{0.25}Ga_{0.75}As$.

In one embodiment, the second III-V compound layer is etched to from the opening by induced coupling plasma (ICP).

In one embodiment, the barrier layer is formed by ALD, MBE, or MOCVD, the barrier layer is silicon doped InP, and a InP doping concentration of the barrier layer is $1.0\times10^{18}$ $cm^{-3}$~$1.5\times10^{18}$ $cm^{-3}$, a thickness of the barrier layer is 50 nm~100 nm.

In one embodiment, the gate dielectric layer is formed by MOCVD, ALD, or MBE, the thickness of the gate dielectric layer is 1 nm-5 nm, and the gate dielectric layer is $Al_2O_3$ or $TiSiO_x$.

In one embodiment, the gate electrode is formed by physical vapor deposition (PVD), MOCVD, ALD, or MBE, and the gate electrode is TiN, NiAu or CrAu.

In one embodiment, the method further comprises of forming a source electrode on the source region, and a drain electrode on the drain region respectively.

In one embodiment, the source electrode and the drain electrode is one of TiN, NiAu and CrAu.

The present invention application provides a field-effect transistor and method of making it. A width of a band gap of the barrier layer is wider than a width of a band gap of the first III-V compound layer, and a curvature of the band gap of the barrier layer is different than a curvature of the band gap of the first III-V compound layer, therefore, two-dimensional electron gas (2DEG) is accumulated between the first III-V compound layer and the barrier layer. Since the 2DEG with higher mobility are used as the majority carriers of the field effect transistors, the transmission performance of the field-effect transistor can be enhanced substantially.

BRIEF DESCRIPTION OF THE DRAWINGS

Exemplary embodiments will be more readily understood from the following detailed description when read in conjunction with the appended drawing, in which.

DETAILED DESCRIPTION

For a more complete understanding of the present disclosure and its advantages, reference is now made to the following description taken in conjunction with the accompanying drawings, in which like reference numbers indicate like features. Persons having ordinary skill in the art will understand other varieties for implementing example embodiments, including those described herein.

The main idea of the present invention is to provide a field-effect transistor and method of making it. The germanium nanowire and the first III-V compound layer form a channel of the III-V/germanium quantum well, a width of a band gap of the barrier layer is wider than a width of a band gap of the first III-V compound layer, and a curvature of the band gap of the barrier layer is different than a curvature of the band gap of the first III-V compound layer, therefore, two dimensional electron gas (2DEG) is accumulated between the first III-V compound layer and the barrier layer. Since the 2DEG with higher mobility are used as the majority carriers of the field effect transistors, the transmission performance of the field-effect transistor can be enhanced substantially. Further, the field-effect transistor is a gate-all-around dielectric device that also increases its electrical performance.

Reference is now made to the following description taken in conjunction with the accompanying drawings. The invention application provides a field-effect transistor shown in FIG. 1, this field-effect transistor includes a semiconductor substrate 100, a germanium nanowire 211 on the semiconductor substrate 100, a first III-V compound layer 212 surrounding around the first germanium nanowire 211, a barrier layer 220, a gate dielectric layer 231, and a gate electrode 232 sequentially formed on the first III-V compound layer 212, a source region 241 and a drain region 242 are also on the a first gate dielectric layer 231, and located at each side of the gate electrode 232 respectively.

Figure 1:
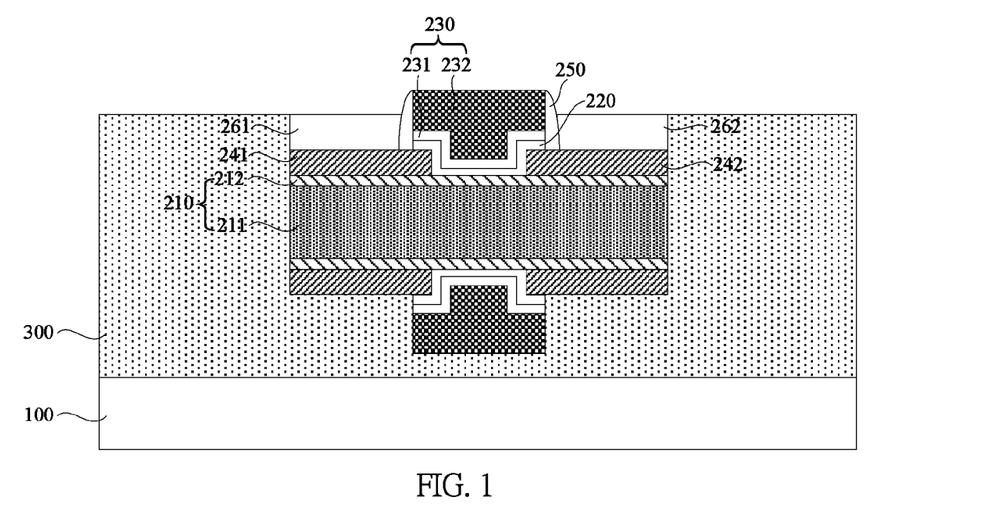
FIG. 1 is a cross-sectional view of a field-effect transistor according to one embodiment of the present invention.

In one embodiment, the germanium nanowire 211 is doped with P-type impurities, and the cross section of the germanium nanowire 211 is round with diameter of 10 nm~100 nm. The first III-V compound layer 212 is N-type InGaAs with a thickness of 10 nm~100 nm. The germanium nanowire 211 and the first III-V compound layer 212 form a channel 210 of the N-type field effect transistor, that is, the channel of III-V/germanium quantum well transistor.

The material of the barrier layer 220 is silicon doped InP, and the InP doping concentration is $1.0\times10^{18}$ $cm^{-3}$~$1.5\times10^{18}$ $cm^{-3}$. The thickness of the barrier layer 220 is 50 nm~100 nm. A heterojunction structure of the field-effect transistor is formed between the barrier layer 220 and the first III-V compound layer 212, a width of a band gap of the barrier layer is wider than a width of a band gap of the first III-V compound layer, and a curvature of the band gap of the barrier layer is different than a curvature of the band gap of the first III-V compound layer when biased on the gate electrode, therefore, two dimensional electron gas (2DEG) is accumulated between the first III-V compound layer 212 and the barrier layer 220. Since the 2DEG with higher mobility are used as the majority carriers of the field effect transistors, the transmission performance of the field-effect transistor can be enhanced substantially.

The gate dielectric layer 231 is a high dielectric constant (K) material, and the thickness of the gate dielectric layer 231 is 1 nm~5 nm. The material of the gate 232 is chosen from TiN, NiAu, and CrAu. The gate dielectric layer 231 and the gate electrode 232 form a gate of field-effect transistor 230. It should be noted that the field-effect transistor is entirely surrounded by gates to enhance the electrical performance of the field-effect transistor.

In one embodiment, the field effect transistor is an N-type field-effect transistor. The source region 241 and drain region 242 are $In_{0.25}Ga_{0.75}As$ doped by N-type impurities. The N-type field-effect transistor further comprises sidewalls 250 positioned at two opposite sides of the gate electrode 232, a source electrode 261 on the source region 241, and a drain electrode 262 on the drain region 242. The sidewalls 250 are silicon dioxide or silicon nitride to protect the gate electrode 232.

Figure 2:
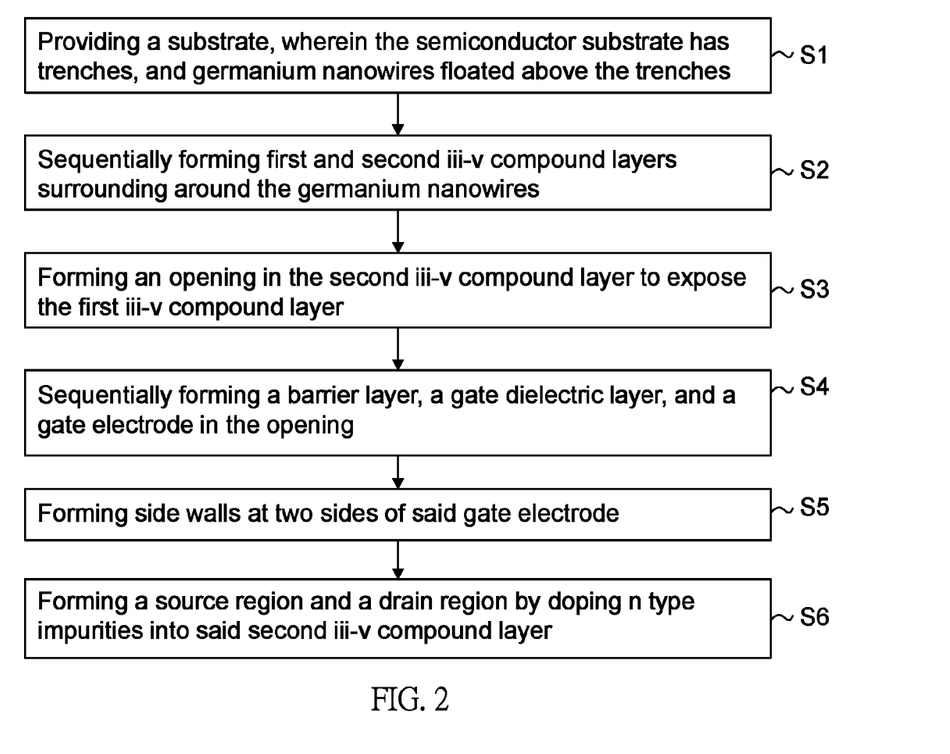
FIG. 2 is a flowchart of a method for manufacturing a field-effect transistor according to one embodiment of the present invention.

The present invention further provides a method for manufacturing a field-effect transistor. FIG. 2 is a flowchart for manufacturing a field-effect transistor, wherein FIGS. 3a~3m are cross-sectional views of the field-effect transistor during the manufacture process of the field-effect transistor. The method for manufacturing the field-effect transistor is described below.

S1 to S6 steps are shown in FIG. 2. In S1 step, providing a semiconductor substrate 100, several trenches, germanium nanowires, wherein the trenches are disposed in the semiconductor substrate 100, and the germanium nanowires are floated above these trenches.

Figure 3A:
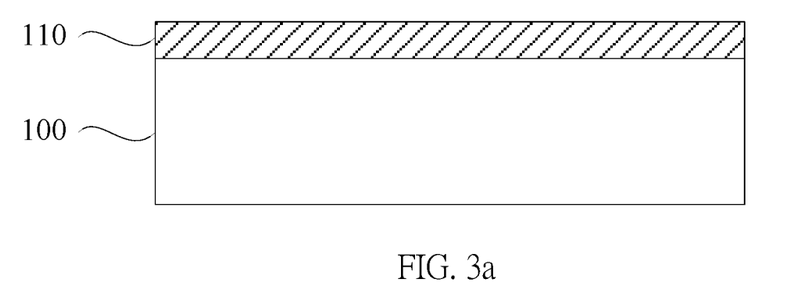
FIGS. 3a-3m are respectively cross-sectional views for manufacturing a field-effect transistor according to one embodiment of the present invention.

The detail contents of S1 step are shown in FIGS. 3a-3g. Referring to FIG. 3a, the semiconductor substrate 100 is covered with a silicon germanium alloy layer 110.

Figure 3B:
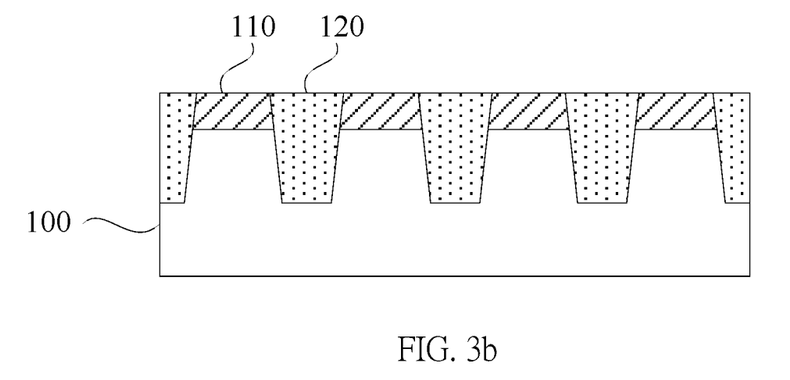

Referring to FIG. 3b, a plurality of shallow trench isolations 120 are formed in the semiconductor substrate 100, and the plurality of shallow trench isolations 120 are spaced apart and the silicon germanium alloy layer 110 is segmented by the shallow trench isolations 120.

Figure 3C:
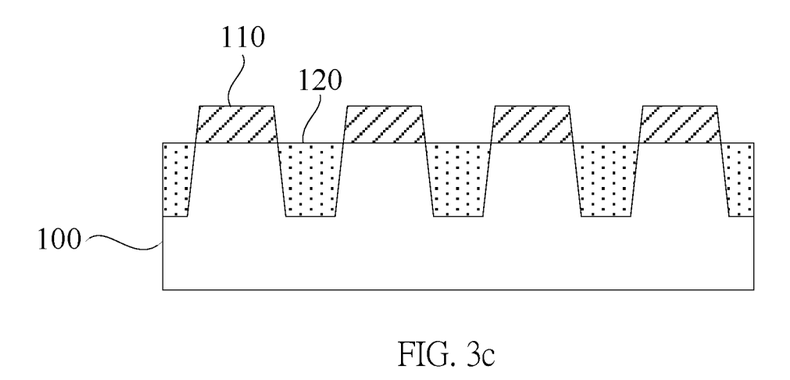

Referring to FIG. 3c, a part of each shallow trench 120 is removed, and sidewalls of the silicon germanium alloy layer 110 are exposed.

Figure 3D:
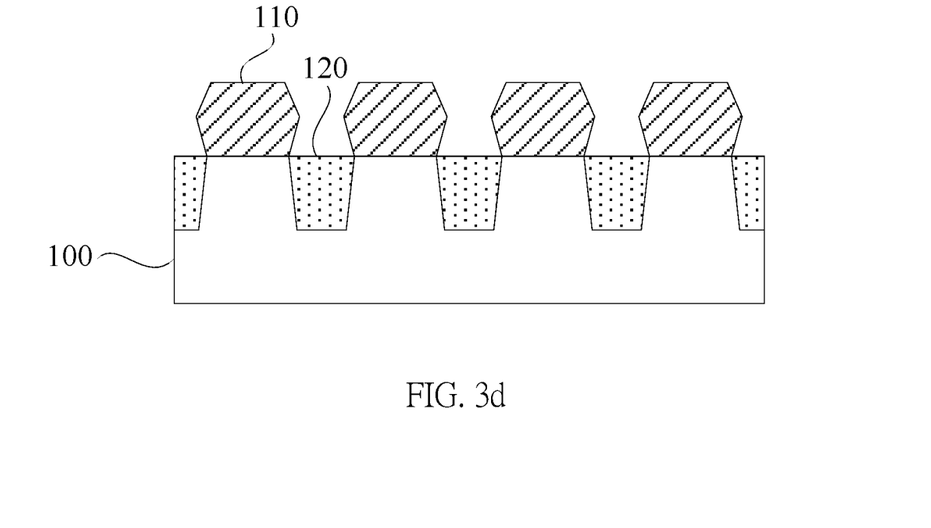

Referring to FIG. 3d, the silicon germanium alloy layer 110 can become a polygon shaped silicon germanium alloy layer via a selective epitaxial growth because growth rates of the silicon germanium alloy layer 110 in all crystal orientations are not the same. For example, the silicon germanium alloy layer 110 can become a hexagon shaped silicon germanium alloy layer via the selective epitaxial growth. It is convenient to oxidize the polygon shaped silicon germanium alloy layer to form a germanium nanowire.

Figure 3E:
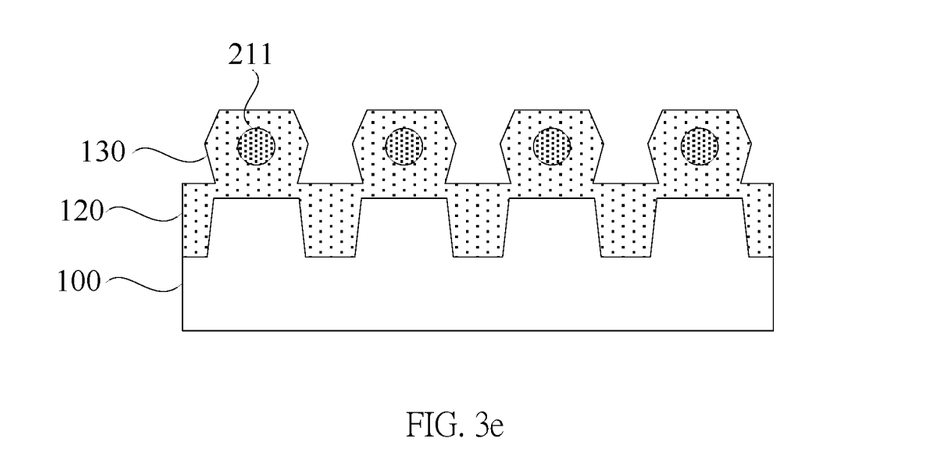

Referring to FIG. 3e, the polygon shaped silicon germanium alloy layer 110 is transferred to a silicon oxide layer 130, wherein the silicon oxide layer 130 surrounds around the germanium nanowire 211. During the thermal oxidation, silicon and germanium are oxidized and concentrated to become the germanium nanowire 211. In one embodiment, the cross sections of the germanium nanowire 211 are circular shapes, and the diameters of the germanium nanowire 211 are 10 nm~100 nm. Moreover, the silicon oxide layer 130 is covered with the semiconductor substrate 100 during the thermal oxidation.

Figure 3F:
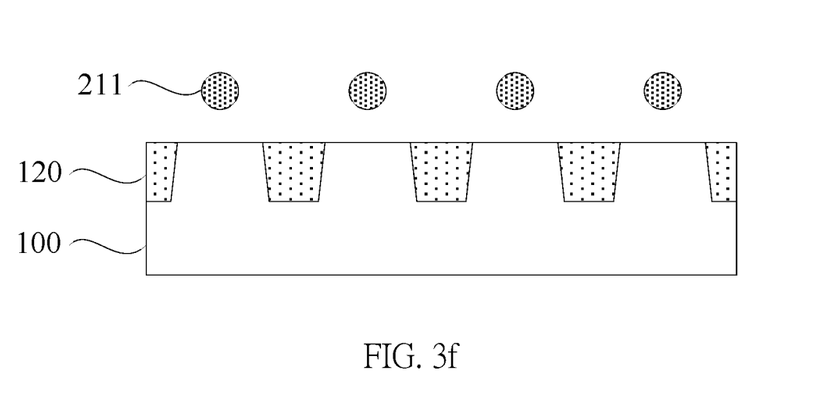

Referring to FIG. 3f, several trenches (not shown in the figure) are formed via removing the silicon oxide layer 130, and the germanium nanowires 211 are floated in the trenches. The germanium nanowires 211 are annealed at a hydrogen atmosphere so that the surfaces of the germanium nanowires 211 become smoother.

Figure 3G:
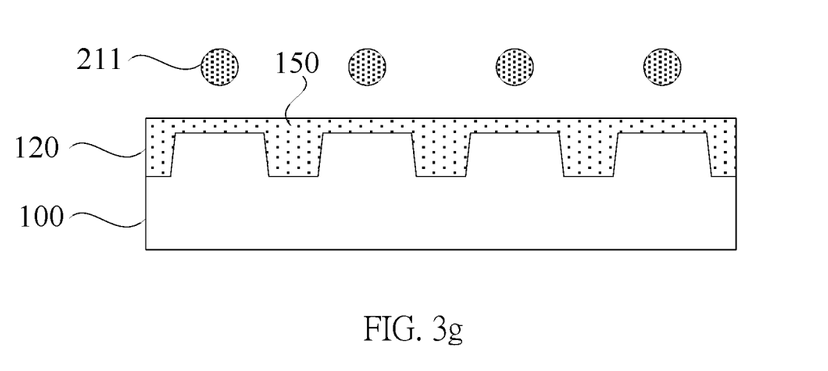

Referring to FIG. 3g, another silicon oxide layer 150 is formed in the trenches in order to protect the semiconductor substrate 100 from damage during subsequent processes.

Figure 3H:
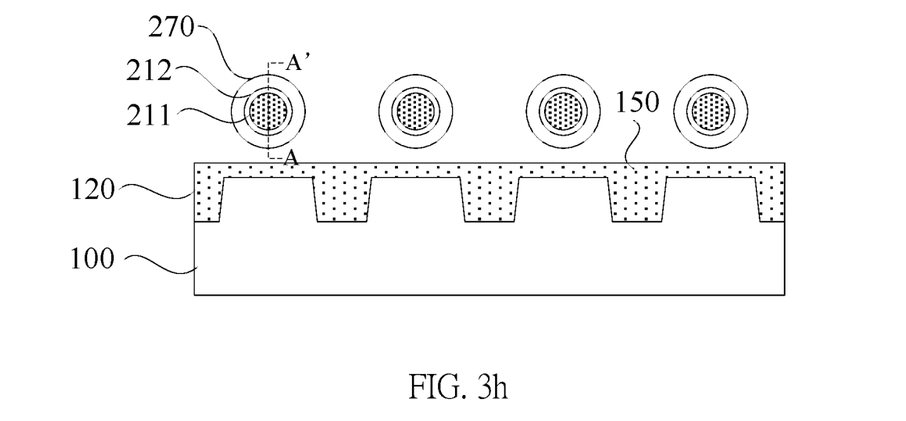
Figure 3I:
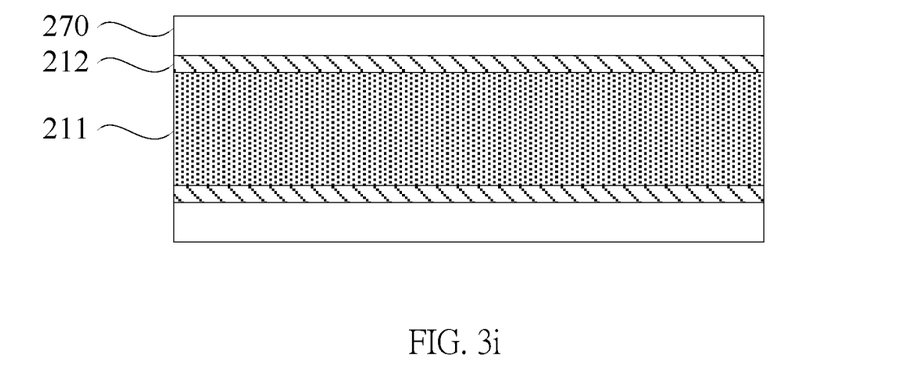

S2 step is shown in FIGS. 3h and 3i, and FIG. 3i is a cross-sectional view of FIG. 3h along a AA' direction. Forming the first III-V compound layer 212, and the second III-V compound layer 270, wherein the first III-V compound layer 212 and the second III-V compound layer 270 surrounded around the germanium nanowire 211 sequentially. In one embodiment, the first III-V compound layer 212 is manufactured by atomic layer deposition (ALD), molecular beam epitaxy (MBE), or metal organic chemical vapor deposition (MOCVD). The materials of the first III-V compound layer 212 is N type InGaAs. The second III-V compound layer 270 is manufactured by MOCVD, ALD, or MBE. The materials of the second III-V compound layer 270 is $In_{0.25}Ga_{0.75}As$. The thickness of the first III-V compound layer 212 and the second III-V compound layer 270 is 10 nm~200 nm.

Figure 3J:
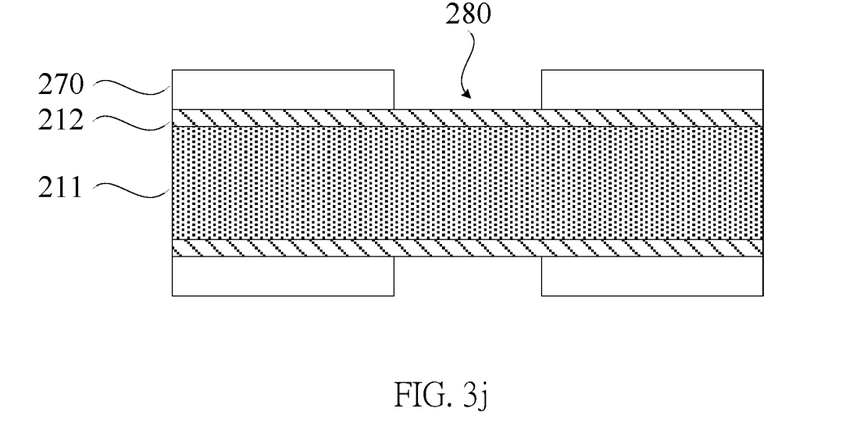

S3 step is shown in FIG. 3j. Etching the second III-V compound layer 270 to form an opening 280, wherein the first III-V compound layer 212 is exposed in the opening 280. The second III-V compound layer 270 is etched by induced coupling plasma (ICP).

Figure 3K:
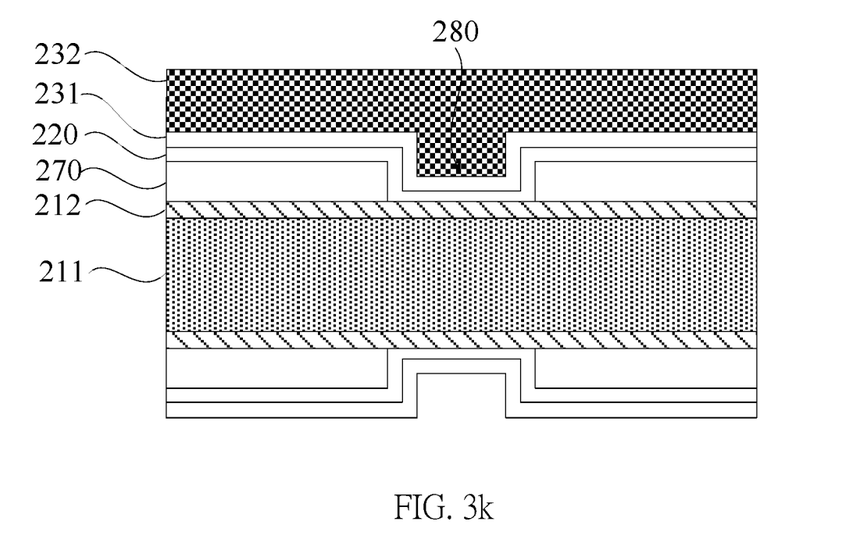

S4 step is shown in FIG. 3k. Sequentially forming a barrier layer 220, a gate dielectric layer 231, and a gate layer 232 in the opening 280. In one embodiment, the barrier layer 220 can be formed by the MOCVD, ALD, or MBE techniques. The materials of the barrier layer 220 is silicon doped InP, and the doping concentration of the barrier layer 220 is $1.0 \times 10^{18}$ cm$^{-3}$~$1.5 \times 10^{18}$ cm$^{-3}$. The thickness of the barrier layer 220 is 50 nm~100 nm. The gate dielectric layer 231 is manufactured by MOCVD, ALD, or MBE, and the gate dielectric layer 231 is high dielectric constant (high k) materials. For example, a material of the gate dielectric layer 231 is $Al_2O_3$ or $TiSiO_x$, and a thickness of the gate dielectric layer 231 is 1 nm-5 nm. The gate layer 232 is manufactured by physical vapor deposition (PVD), MOCVD, ALD, or MBE, and a material of the gate layer 232 is TiN, NiAu or CrAu. The barrier layer 220, the gate dielectric layer 231, and the gate layer 232 are entirely surrounded around the channel 210. The field-effect transistor of the present invention is a gate-all-around dielectric device that increases its electrical performance.

Figure 3L:
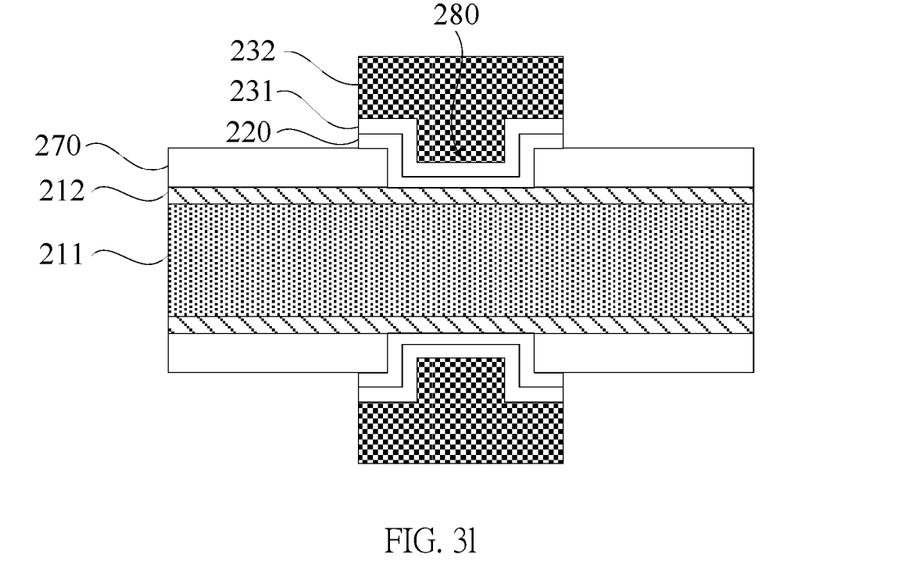

Referring to FIG. 3l, etching a portion of the gate layer 232, the gate dielectric layer 231, and the barrier layer 220, retaining the gate layer 232, the gate dielectric layer 231, and the barrier layer 220 inside the opening 280 as well as a portion on the second III-V compound layer 270. In one embodiment, the barrier layer 220 is used to adjust the density of 2DEG in the first III-V compound layer 212, therefore, it cam control the working current of the field effect transistor.

Figure 3M:
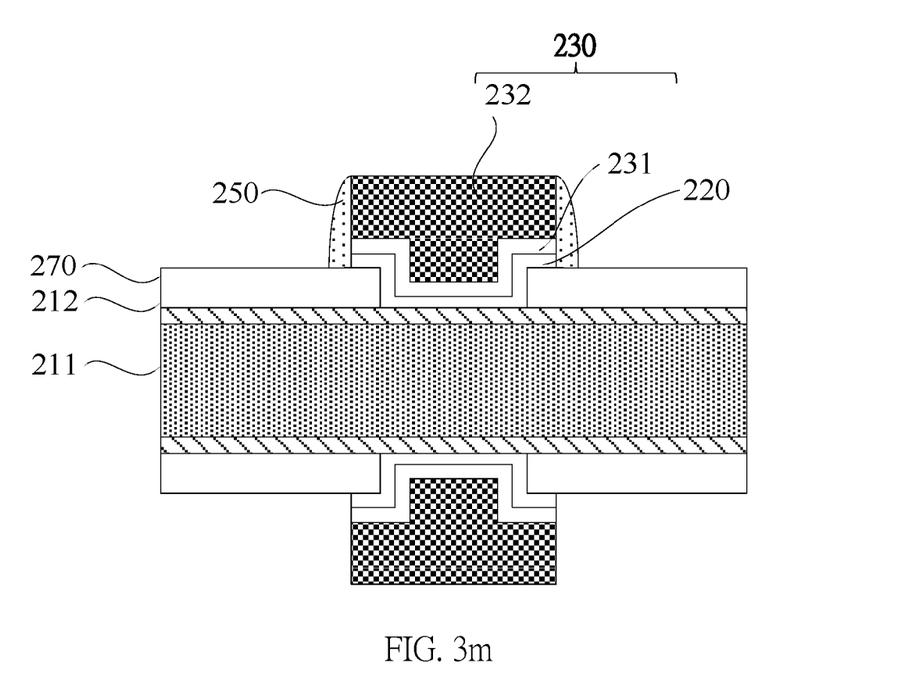

S5 step is shown FIG. 3m. Forming the sidewalls 250 at two sides of the gate layer 232 on the second III-V compound layer 270, wherein the sidewalls 250 are sued to protect the gate electrode 230.

Figure 4:
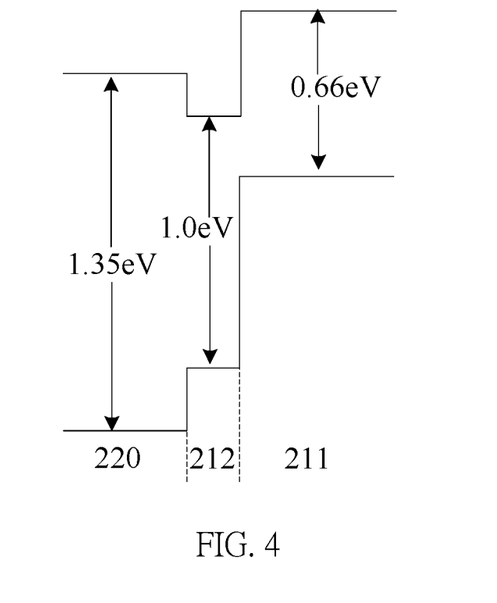
FIG. 4 is an energy band diagram of a non-biased field-effect transistor according to one embodiment of the present invention.

S6 step is shown in FIG. 4. Forming the source region 241 and the drain region 242 by implanting N type impurities into the second III-V compound layer 270. According to the present invention, a simple method for manufacturing a source and a drain can form a nonplanar field effect transistor having a smaller parasitic resistance. Moreover, the method for manufacturing a field-effect transistor further comprises a step of forming the source electrode 261 on the source region 241, a step of forming the drain electrode 262 on the drain region 242. A material of the source electrode 261 and the drain electrode 262 is TiN, NiAu or CrAu.

Figure 5:
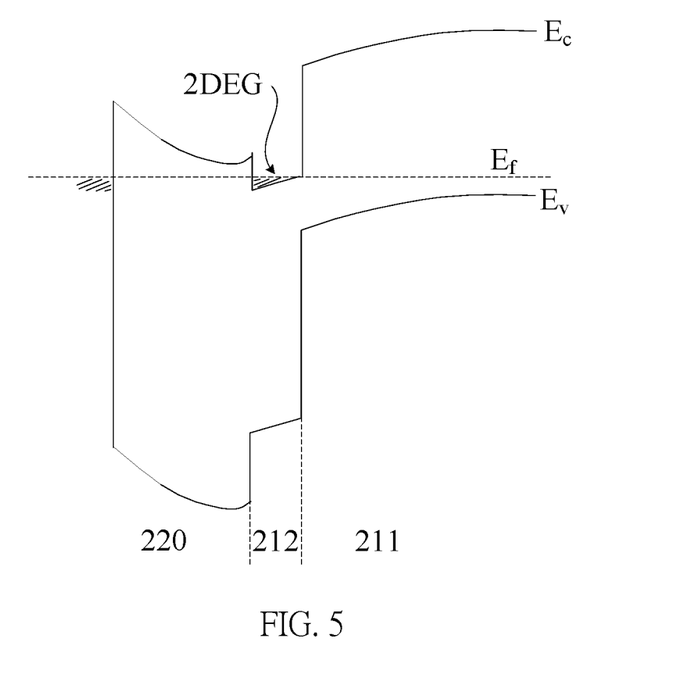
FIG. 5 is an energy band diagram of a forward-biased N-type field-effect transistor according to one embodiment of the present invention.

Referring to FIG. 4, when an input port (IN) is not biased, energy bands of the field effect transistor are not bent. Referring to FIG. 5, when the input port (IN) is forward biased, a width of a band gap of the barrier layer 220 is wider than a width of a band gap of the first III-V compound layer 212, and a curvature of the band gap of the barrier layer 220 is different than a curvature of the band gap of the first III-V compound layer 212. Moreover, when the input port (IN) is forward biased, a conduction band (Ec) drops below Fermi energy level (Ef) and two-dimensional electron gas (2DEG) is accumulated between the first III-V compound layer 212 and the barrier layer 220, the field effect transistor is turn on, and the output port (OUT) is coupled with a ground (GND). According to the present invention, 2DEG with higher mobility are used as the majority carriers of the field effect transistors, such that the transmission performance of the field-effect transistor can be enhanced substantially.

In conclusion, a width of a band gap of the barrier layer is wider than a width of a band gap of the first III-V compound layer, and a curvature of the band gap of the barrier layer is different than a curvature of the band gap of the first III-V compound layer, therefore, two-dimensional electron gas (2DEG) is accumulated between the first III-V compound layer and the barrier layer. Since the 2DEG with higher mobility are used as the majority carriers of the field effect transistors, the transmission performance of the field-effect transistor can be enhanced substantially. Further, the field-effect transistor is a gate-all-around dielectric device that also increases its electrical performance.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A field-effect transistor, comprising:
   a semiconductor substrate;
   a germanium nanowire;
   a first III-V compound layer surrounding around said germanium nanowire;
   a barrier layer, a gate dielectric layer, and a gate electrode sequentially on said first III-V compound layer; and
   a source region and a drain region on said first III-V compound layer and at one side of said gate electrode respectively.

2. The field-effect transistor according to claim 1, wherein said germanium nanowires are doped with P type impurities, cross sections of said germanium nanowires are circular shapes, and the thickness of said germanium nanowires are 10 nm~100 nm.

3. The field-effect transistor according to claim 1, wherein said first III-V compound layer is N type InGaAs, and the thickness of said first III-V compound layer is 10 nm~100 nm.

4. The field-effect transistor according to claim 1, wherein said barrier layer is silicon doped InP, and the InP doping concentration is $1.0 \times 10^{18}$ cm$^{-3}$~$1.5 \times 10^{18}$ cm$^{-3}$, the thickness of said barrier layer is 50 nm~100 nm.

5. The field-effect transistor according to claim 1, wherein said gate dielectric layer is high dielectric constant materials, said gate dielectric layer is $Al_2O_3$, or $TiSiO_x$, and the thickness of said gate dielectric layers is 1 nm~5 nm.

6. The field-effect transistor according to claim 1, wherein said gate electrode is a material of TiN, NiAu or CrAu.

7. The field-effect transistor according to claim 1, wherein said source region and said drain region comprise $In_{0.25}Ga_{0.75}As$ doped with N-type impurities.

8. The field-effect transistor according to claim 1, wherein said field effect transistor further comprises sidewalls at two sides of said gate electrode, a source electrode on said source region, and a drain electrode on said drain region.

* * * * *